Jan. 28, 1964 M. FISCHMAN 3,119,972

TRANSISTOR PULSE OSCILLATOR WITH SERIES RESONANT CIRCUIT

Filed Dec. 27, 1961

INVENTOR.
MARTIN FISCHMAN

BY R. J. Frank
ATTORNEY

United States Patent Office 3,119,972

Patented Jan. 28, 1964

3,119,972

TRANSISTOR PULSE OSCILLATOR WITH SERIES RESONANT CIRCUIT

Martin Fischman, Wantagh, N.Y., assignor to General Telephone and Electronics Laboratories, Inc., a corporation of Delaware Filed Dec. 27, 1961, Ser. No. 162,399
6 Claims. (Cl. 331—113)

Figure 1:
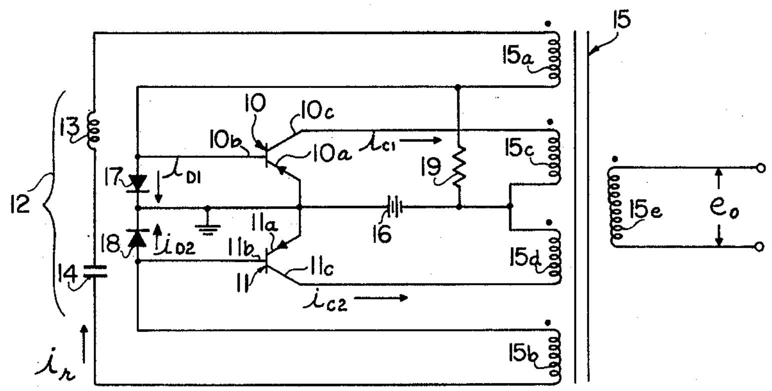

This invention relates to pulse oscillators and, in particular, to a frequency stable pulse oscillator.

Oscillators designed to generate pulses having steep leading and trailing edges find wide application in television receivers, radar, and similar types of equipment. These known pulse oscillators are generally of the relaxation type in which the frequency is determined by resistance-capacitance or resistance-inductance networks. However, it has been found that in relaxation oscillators relatively small changes in supply voltage, transistor characteristics due to environmental condition, or loading produce relatively large frequency variations. These variations make relaxation oscillators unsuitable for many applications requiring high frequency stability. Accordingly, it is an object of my invention to provide an improved pulse oscillator having good frequency stability.

It is another object of my invention to provide to pulse oscillator in which the pulse duration is precisely equal to the interval between pulses.

Still another object is to provide a pulse oscillator in which the frequency of operation is substantially independent of the power supply voltage.

Yet another object is to provide a highly efficient pulse oscillator in which the operating frequency is adjustable over wide limits.

A further object is to provide a pulse oscillator in which the trasnformer core need not have saturating characteristics.

A still further object is to provide a pulse oscillator capable of generating symmetrical square wave pulses having steep leading and trailing edges.

Another object is to provide an inverter circuit for converting a direct voltage to an alternating voltage having a precisely determined and controlled frequency.

In the present invention, a pulse oscillator is provided which comprises first and second transistors each having first, second, and third electrodes, a series resonant circuit having first and second ends, and a transformer having at least first, second, third and fourth windings. The period of oscillation is determined by the resonant frequency of the series resonant circuit. The first winding of the transformer is coupled between the first end of the series resonant circuit and the second electrode of the first transistor. The second winding of the transformer is coupled between the second end of the series resonant circuit and the second electrode of the second transistor. One end of the third winding is connected to one end of the fourth winding, the junction of the two windings being coupled through a voltage source to the first electrodes of both transistors. The other ends of the third and fourth windings are coupled to the third electrodes of the first and second transistor respectively.

First and second asymmetrically conducting means are coupled between the first and second electrodes of the first and second transistors respectively. In this way, low impedance paths are provided in parallel with the first and second electrodes of the transistors thereby permitting the current to flow through the series resonant circuit during the entire cycle of oscillation.

In one embodiment of the invention, the first, second, and third electrodes of the transistors correspond to the emitter, base, and collector electrodes respectively. The asymmetrically conducting means consists of first and second diodes connected between the emitter and base of the first and second transistors respectively, the emitter-base circuit of each transistor (hereinafter termed the emitter-base diode) acting as a diode poled in the opposite direction from that of the actual diode connected across it.

When the oscillator is oscillating under steady state conditions a large sinusoidal current circulates through a series circuit consisting of the resonant circuit, the first and second windings of the transformer, the parallel combination of the first diode and the emitter-base diode of the first transistor and the parallel combination of the second diode and the emitter-base diode of the second transistor. During one half of the cycle, the first diode and the emitter-base diode of the second transistor are driven into conduction by the sinusoidal current and during the other half of the cycle the second diode and the emitter-base diode of the first transistor are driven into conduction. Since the emitter-base diodes conduct on alternate half cycles, the transistors are driven into saturation on alternate half cycles producing square wave voltages of opposite polarity at the collector of each transistor. The collector voltages are alternately coupled from the third and fourth windings to the first and second windings respectively of the transformer with a reversal of polarity thereby providing the drive for the series resonant circuit.

In order to achieve high frequency stability, the resistance in series with the resonant circuit must be low. This resistance includes the resistance reflected into the first and second windings of the transformer. When the first transistor is conducting and the second transistor is non-conducting, the impedances reflected into the first and second windings of the transformer are low because of the shunting action of the low impedance emitter-collector path of the first transistor across the third transformer winding. Similarly, when the second transistor is conducting and the first transistor non-conducting, the impedances reflected into the first and second windings of the transformer remain low because of the shunting action of the low impedance emitter-collector path of the second transistor.

Since the transistors are arranged to conduct alternately, the peak-to-peak current swing is symmetrical about zero current thereby assuring maximum utilization of the transformer core. In addition, the push-pull switching circuit provides a low resistance path for the current through the series resonant circuit without introducing an appreciable power loss. By using a resonant circuit to control the frequency instead of saturation of the transformer core as in conventional oscillators and inverters, the output frequency can be precisely controlled despite variations in supply voltage, environment, or loading.

Figure 2:
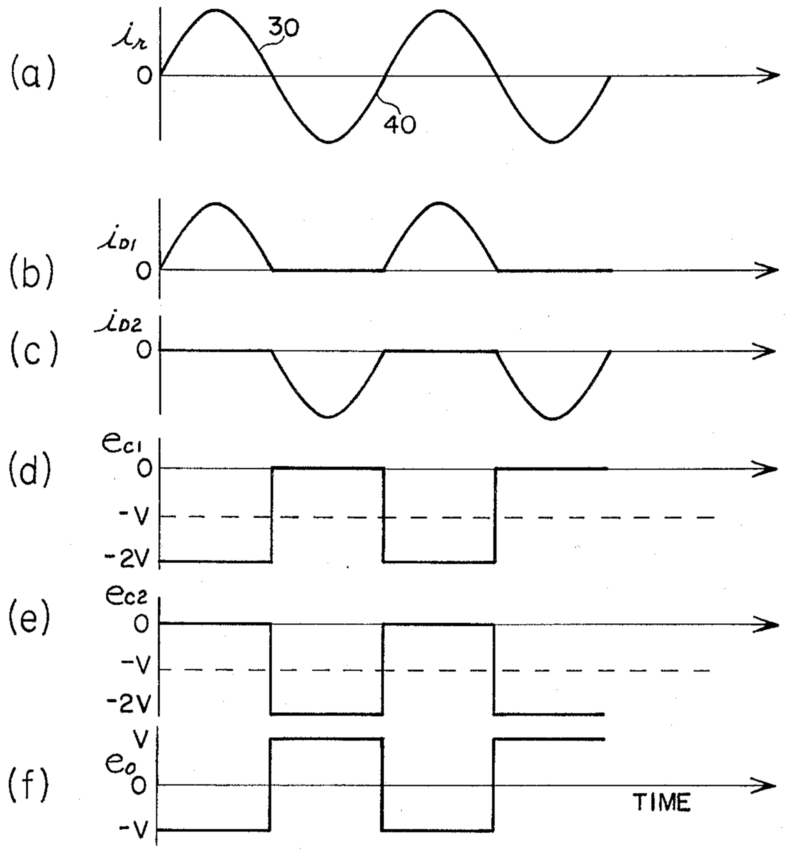

The above objects of and the brief introduction to the present invention will be more fully understood and further objects and advantages will become apparent from a study of the following description in connection with the drawings wherein:

FIG. 1 is a schematic diagram of the pulse oscillator of the present invention; and FIG. 2 illustrates idealized voltage and current waveforms appearing in the circuit of FIG. 1.

Referring to FIG. 1, there is shown a pulse oscillator comprising first and second type PNP transistors 10 and 11. Transistor 10 is provided with an emitter electrode 10*a*, a base electrode 10*b* and a collector electrode 10*c* and transistor 11 is provided with an emitter electrode 11*a*, a base electrode 11*b* and a collector electrode 11*c*. A series resonant circuit 12, consisting of an inductance 13 and a capacitor 14, determines the frequency of the output signal appearing across the windings of a transformer 15.

A first winding 15*a* of transformer 15 is connected between one end of the resonant circuit 12 and the base 10*b* of transistor 10. A second winding 15*b* is connected between the other end of resonant circuit 12 and the base 11*b* of transistor 11. Third and fourth windings 15*c* and 15*d* of transformer 15 are connected in series and to the collector electrodes 10*c* and 11*c* of transistor 10 and 11 respectively. A direct voltage source 16, having a magnitude V, is connected between the junction of windings 15*c* and 15*d* and the emitters 10*a* and 11*a* of transistors 10 and 11.

A first diode 17 is connected between the base and emitter of transistor 10 and a second diode 18 is coupled between the base and emitter of transistor 11. Diodes 17 and 18 are poled so that current flows through them from the end coupled to the base electrode to the end coupled to the emitter electrode of the associated transistor. Starting voltage for the circuit is coupled to base electrode 10*b* through a resistor 19. An output winding 15*e* is provided on transformer 15 to provide an isolated output for the oscillator.

The number of turns on transformer 15 and the cross-sectional area of the transformer core are so selected that the transformer does not saturate under normal operating conditions. In particular, the product of the turns on winding 15*c* (or 15*d*) and the effective cross-sectional area of the core should fulfill the inequality $$N_P A_c > \frac{V \times 10^3}{4FB}$$

where $N_P$=the number of turns on winding 15c
$A_c$=effective area of the core in square centimeters
$B$=saturation flux density of the core in gauss
$V$=maximum D.C. voltage to be imposed on the circuit
$F$=minimum operating frequency in cycles per second Operation of the circuit may be best described by assuming that the oscillator has been operating for a sufficient number of cycles for the initial starting transients to have died down. Under these conditions, a large sinusoidal current $i_T$ (FIG. 2*a*) flows through the series resonant circuit 12 driving diode 17 and the emitter-base diode of transistor 11 into conduction on one half cycle and driving diode 18 and the emitter-base diode of transistor 10 into conduction on the other half cycle. Thus, on the first half cycle (shown at 30 in FIG. 2*a*) transistor 10 and diode 18 do not conduct. During this interval, current $i_{D1}$ flows through diode 17, the emitter 11*a* and base 11*b* of transistor 11, winding 15*b* of transformer 15, resonant circuit 12, and winding 15*a* back to diode 17. This current is shown in FIG. 2*b*. The emitter-base current through transistor 11 drives the transistor into saturation and a current $i_{c2}$ begins to flow in the collector 11*c*, transformer winding 15*d*, voltage source 16 and back to the emitter 11*a*. The voltage produced across winding 15*d* by the collector current $i_{c2}$ is inductively coupled to winding 15*b* resulting in positive feedback from the collector to the base of transistor 11. The magnitude of the feedback and the gain of transistor 11 is sufficient to cause the transistor current $i_{c2}$ to build up and rapidly enter the saturation region of the transistor characteristic. In this region, the collector current $i_{c2}$ is independent of the base current, the voltages across transistor 11 remaining practically in an equilibrium state for a period of time due to the lack of dynamic gain under these conditions.

The voltage $e_{c2}$ (FIG. 2*e*) between the collector electrode 11*c* and the grounded emitters is essentially zero during the first half cycle due to the very low emitter-collector impedance of transistor 11 when it is in conduction. This low impedance is shunted directly across windings 15*d* of the transformer. As a result the impedances of windings 15*a* and 15*b* are also low and the current $i_T$ in the resonant circuit is high. During this interval the collector voltage $e_{c1}$ (FIG. 2*d*) of the non-conducting transistor 11 is $-2$ *v*.

Similarly, during the second half of the cycle 40 (FIG. 2*a*) transistor 11 and diode 17 are non-conducting, current $i_{D2}$ flowing through diode 18, the emitter 10*a* and base 10*b* of transistor 10, winding 15*a* of transformer 15, resonant circuit 12, and winding 15*b* back to diode 18. This current is shown in FIG. 2*c*. Transistor 10 is driven into saturation during the second half of the cycle in the same way as has been described for the operation of transistor 11 during the first half of the cycle. The voltage $e_{c1}$ between the collector and emitter of transistor 10 is essentially zero as shown in FIG. 2*d* and the collector-emitter voltage $e_{c2}$ of transistor 11 is equal to $-2$ *v*. The low impedance of the collector-emitter path of transistor 10 is connected across winding 15*c* effectively shunting windings 15*a* and 15*b* thereby maintaining the impedance in series with resonant circuit 12 at a low value. Thus, the transistors are alternately driven in and out of saturation by the operation of the resonant circuit resulting in a highly symmetrical square output voltage (FIG. 2*f*) having precise on and off periods.

In a typical circuit, the values of the components are as follows:

| | |
|---|---|
| Transistors 10 and 11 | Type 2N 428. |
| Diodes 17 and 18 | Type 1N 279. |
| Inductance 13 | 1 millihenry. |
| Capacitance 14 | 270 micromicrofarads. |
| Resistor 19 | 100,000 ohms. |
| Voltage source 16 | −10 volts. |

Ratio of transformer windings

15*a*:15*b*:15*c*:15*d*:15*e*=1:1:3:3:1

With the oscillator operating at a nominal frequency of 300 kilocycles, the frequency changed approximately 0.1% as the supply voltage was varied from −5 to −15 volts thereby indicating the excellent frequency stability obtainable with the circuit.

This circuit may also be used as an inverter for converting a direct voltage source to an alternating square wave voltage having a precisely controlled frequency. In this application, the source 16 represents the input voltage and the output voltage is obtained across winding 15*e*.

Transistors 10 and 11 may be type NPN instead of type PNP, if desired, in which case the polarity of diodes 17 and 18 and the supply voltages must be reversed. Also the series resonant circuit 12 may comprises a crystal in lieu of the series inductance 13 and capacitor 14.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. A pulse oscillator comprising (*a*) first and second transistors each having first, second and third electrodes respectively, the first electrodes of said first and second transistors being coupled together, (*b*) a series resonant circuit having first and second ends, (*c*) a transformer having at least first, second, third, and fourth windings, the first winding of said transformer being coupled between the first end of said series resonant circuit and the second electrode of said first transistor, the second winding of said transformer being coupled between the second end of said series resonant circuit and the second electrode of said second transistor, and the third and fourth windings being coupled across the first and third electrodes of said first and second transistors respectively, and (*d*) first and second asymmetrically conducting means coupled between the first and second electrodes of said first and second transistors respectively, an output signal appearing across the windings of said transformer having a frequency determined by the resonant frequency of said series resonant circuit.

2. A pulse oscillator comprising (*a*) first and second transistors each having first, second and third electrodes respectively, the first electrodes of said first and second transistors being coupled together, (*b*) a series resonant circuit having first and second ends, (*c*) a transformer having at least first, second, third, and fourth windings, the first winding of said transformer being coupled between the first end of said series resonant circuit and the second electrode of said first transistor, the second winding of said transformer being coupled between the second end of said series resonant circuit and the second electrode of said second transistor, and third and fourth windings being coupled between the first and third electrodes of said first and second transistors respectively, and (*d*) first and second diodes coupled between the first and second electrodes of said first and second transistors respectively, an output signal appearing across the windings of said transformer having a frequency determined by the resonant frequency of said series resonant circuit.

3. A pulse oscillator comprising (*a*) first and second transistors each having emitter, base, and collector electrodes respectively, the emitters of said first and second transistors being coupled together, (*d*) a series resonant circuit having first and second ends, (*c*) a transformer having at least first, second, third, and fourth windings, the first winding of said transformer being coupled between the first end of said series resonant circuit and the base electrode of said first transistor, the second winding of said transformer being coupled between the second end of said series resonant circuit and the base electrode of said second transistor, and the third and fourth windings being coupled between the emitter and collector electrodes of said first and second transistor respectively, and (*d*) first and second diodes coupled between the emitter and base electrodes of said first and second transistors respectively, an output signal appearing across the windings of said transformer having a frequency determined by the resonant frequency of said series resonant circuit.

4. A pulse oscillator comprising (*a*) first and second transistors each having emitter, base, and collector electrodes respectively, the emitters of said first and second transistors being coupled together, (*b*) a series resonant circuit having first and second ends, (*c*) a transformer having at least first, second, third and fourth windings, the first winding of said transformer being coupled between the first end of said series resonant circuit and the base electrode of said first transistor, the second winding of said transformer being coupled between the second end of said series resonant circuit and the base electrode of said second transistor, and the third and fourth windings being coupled in series with the collector electrodes of said first and second transistors, (*d*) means coupling the junction of said third and fourth windings to the emitters of said first and second electrodes, and (*e*) first and second diodes coupled between the emitter and base electrodes of said first and second transistors respectively, an output signal appearing across the windings of said transformer having a frequency determined by the resonant frequency of said series resonant circuit.

5. The pulse oscillator defined in claim 4 wherein said series resonant circuit comprises an inductor and a capacitor coupled in series.

6. A pulse oscillator comprising (*a*) first and second transistors each having emitter, base, and collector electrodes respectively, the emitters of said first and second transistors being coupled together, (*b*) a series resonant circuit including an inductor and a capacitor, said series resonant circuit having first and second ends, (*c*) a transformer having at least first, second, third and fourth windings, the first winding of said transformer being coupled between the first end of said series resonant circuit and the base electrode of said first transistor, the second winding of said transformer being coupled between the second end of said series resonant circuit and the base electrode of said said second transistor, and the third and fourth windings being coupled in series with the collector electrodes of said first and second transistors, (*d*) a direct voltage source coupled between the junction of said third and fourth windings and the emitters of said first and second transistors (*e*) a starting resistor coupled between the base of one of said transistors and the junction of said third and fourth windings, and (*f*) first and second diodes coupled between the emitter and base electrodes of said first and second transistors respectively, an output signal appearing across the windings of said transformer having a frequency determined by the resonant frequency of said series resonant circuit.

No references cited.